United States Patent [19]

Ito

[11] 4,430,364
[45] Feb. 7, 1984

[54] METHOD FOR FORMING AN ALUMINUM METALLIC THIN FILM BY VAPOR PHASE GROWTH ON A SEMICONDUCTOR SUBSTRATE

[75] Inventor: Takashi Ito, Kawasaki, Japan

[73] Assignee: Fujitsu Limited, Kawasaki, Japan

[21] Appl. No.: 360,661

[22] Filed: Mar. 22, 1982

[30] Foreign Application Priority Data

Mar. 23, 1981 [JP] Japan ................................. 56-42209

[51] Int. Cl.$^3$ ........................................ H01L 21/285
[52] U.S. Cl. .................................... 427/91; 427/99; 427/253
[58] Field of Search ...................... 427/88, 91, 99, 253

[56] References Cited

U.S. PATENT DOCUMENTS 3,471,321 10/1969 Owalline .......................... 427/253
4,328,261 5/1982 Heinecke ........................... 427/99

FOREIGN PATENT DOCUMENTS 1436999 5/1976 United Kingdom ................ 427/91

OTHER PUBLICATIONS

Silvectri, "Aluminum Deposition with Good Step Coverage", IBM TDB, vol. 21, No. 1, Jun. 1978, pp. 396.

Primary Examiner—John D. Smith
Attorney, Agent, or Firm—Staas & Halsey

[57] ABSTRACT

An aluminum thin film (14, 24) for semiconductor devices has been heretofore formed by vacuum deposition. However, because the aluminum to be deposited on a semiconductor substrate by vacuum deposition has a directional property of growth, breakage of the resultant aluminum wiring often occurred at a step or sidewall (2a) of the substrate.

The present invention provides a method for forming the aluminum thin film (14, 24) by chemical vapor deposition, in which $AlCl_3$ is reacted with molten aluminum (46) to form $AlCl$, and the produced $AlCl$ is decomposed into $Al$ and $AlCl_3$ in the vicinity of the semiconductor substrate, i.e. wafer (47), maintained at a low temperature so as to cause the produced $Al$ to be grown on the wafer (47). In accordance with the present invention, the an aluminum thin film (24) having a uniform thickness can be formed.

9 Claims, 5 Drawing Figures

METHOD FOR FORMING AN ALUMINUM METALLIC THIN FILM BY VAPOR PHASE GROWTH ON A SEMICONDUCTOR SUBSTRATE

The present invention relates to a method for forming a metallic thin film. More particularly, the present invention relates to a method for forming an aluminum thin film which may be typically used as a wiring layer, formed by means of delineating the metallic thin film, for electronic devices, such as a semiconductor device.

The wiring for electronic devices is usually formed in such a manner that a metallic thin film is deposited on a substrate and a wiring pattern, is delineated on the substrate by etching the metallic thin film.

The deposition of a metal is carried out by a conventional method, for example, vacuum deposition, sputtering or chemical vapor growth. The metallic materials usable for the preparation of the semiconductor device include aluminum (Al), gold (Au), platinum (Pt), titanium (Ti), tungsten (W), molybdenum (Mo) and the like. Among these, aluminum is most widely used because it exhibits a low resistance when being brought into electrical contact with silicon, of which the substrate of the semiconductor device is made, and it has an excellent bonding property to a silicon dioxide ($SiO_2$) film conventionally used as an insulating material.

Another reason for the wide use of aluminum is that it is easy to form a relatively clean, uniform thin film.

In recent years, a complicated multifunctional system has been realized as a highly integrated semiconductor device, particularly, an LSI. In order to attain a further enhanced degree of integration in the semiconductor device, the fine working and the microminiaturization of wiring layers and various elements, such as transistors, are an important problem. The highly integrated semiconductor device comprises a large number of elements, each having a reduced width, arranged on the substrate having a predetermined area. However, in most cases, number of the elements relative to the thickness of the device in the vertical direction thereof is decreased rather than increased. In other words, as the degree of integration of the semiconductor device is enhanced, the degree of unevenness of the main plane of the substrate becomes greater than usual. That is, in the highly integrated semiconductor device, such as an LSI and the like, wirings in a vertical direction of the substrate and on the surface thereof become complicated, with the result that the area occupied by the wirings relative to the area of the surface of the substrate becomes extremely large. In order to avoid this disadvantage, it is recommended that a multi-layer wiring consisting of two-, three- or more-layered wirings be adopted in place of the conventional mono-layered wiring. In the multi-layer wiring, since the wiring layers must be separated from each other by means of an insulating film, a large step is generated in the portion of the uppermost wiring layer which intersects with, i.e., extends down to, the substrate, to which each wiring layer is to make electrical contact. Therefore, one of the important problems encountered in the preparation of the highly integrated LSI is that each metal conductor of the wiring layer be capable of extending across such a large step without being broken.

An insulating film between the wiring layers can be used with an extremely enhanced accuracy by using ions having a directional property of etching. For example, an opening having a vertical or substantially vertical step can be pierced through the insulating film. However, when an aluminum wiring is formed by the conventional vacuum deposition, the deposition of the metal on the step region becomes discontinuous due to a self-shadow effect, as described hereinafter with reference to FIGS. 3 and 4, and thus, a satisfactory step coverage cannot be attained, with the result that the metal conductor often undergoes breakage. In order to avoid such a poor step coverage, there have been proposed various methods, such as a method comprising partially etching the metal conductor and redepositing the metal on the partially etched conductor; a method comprising incorporating a dissimilar metal to the deposited metal into the metal conductor; a method comprising predepositing a dissimilar metal to the metal to be deposited on the step region as a precoat; and a method comprising subjecting the surface of the deposited metal to sputtering etching or plasma. Some of these methods are put to practical use.

Also, deposition of aluminum by magnetron sputtering is being widely used as a relatively effective method for providing an improved step coverage.

However, even in these methods, the thickness of the metal deposited on the wall or step of the insulating film, which is perpendicular or almost perpendicular to a plane parallel to the substrate is only in the range of from 20 to 30% of that of the metal deposited on the main plane of the substrate. Therefore, a great possibility of breakage still exists in the wall or step, as is the case with the vapor deposition method.

As is well known, silicon can be epitaxially grown on a substrate from $SiCl_4$ and the like by the chemical vapor deposition method (CVD method).

However, the CVD method is not used for the industrial preparation of a thin film of aluminum, because there has not been found a suitable CVD reaction for aluminum having a characteristic of being easily oxidized. Japanese Laid-open Patent Application No. 51-131428 discloses a method for producing an aluminum thin film by the dissociation of an organoaluminum compound by plasma. However, the organoaluminum compound is so explosive that it is unsuitable for practical use.

An object of the present invention is to provide a novel method for forming an aluminum thin film which is required for the preparation of electronic devices, particularly, semiconductor devices.

Another object of the present invention is to attain a higher step coverage of aluminum by chemical vapor deposition than is possible in the conventional vapor deposition.

The present invention is characterized in that a vapor phase growth of an aluminum thin film is carried out by decomposing a monovalent aluminum halide into a trivalent aluminum halide and metallic aluminum and by depositing the metallic aluminum on a substrate maintained at a temperature lower than the melting point of the metallic aluminum.

The disproportionation reaction of the halogen compound used in the present invention can be expressed by the following equation:

$$3AlX \rightarrow AlX_3 + 2Al \qquad (1)$$

wherein $AlX_3$ represents a trivalent aluminum halide and AlX represents a monovalent aluminum halide.

The disproportionation reaction, in which X represents Cl, is illustrated hereafter.

As the temperature is decreased, the reaction of the equation (1) proceeds, so that gaseous AlCl is converted to AlCl$_3$ in a stable state while releasing Al which can be deposited on a substrate as a thin film.

In the method of the present invention for forming an aluminum thin film, the aluminum thin film can be formed on the surface, whether the surface is flat or vertical (step), of a semiconductor element in a uniform thickness, because the aluminum to be deposited has no directional property of growth, as is the case with the aluminum deposited by the conventional vapor deposition. Accordingly, when the present invention is utilized in the preparation of the semiconductor device, an aluminum wiring layer rides across a high step so as to extend continuously in a predetermined direction without being broken, with the consequence that a highly integrated LSI can be produced with high yield.

As AlX$_3$ in the equation (1), AlCl$_3$ is usually used. Other aluminum halides, i.e. AlBr$_3$, AlI$_3$ or mixtures thereof may also be used.

In the disproportionation reaction, a non-oxidizing carrier gas, e.g. H$_2$ or N$_2$, may be used. It is preferable that the disproportionation reaction be carried out in a reducing atmosphere, such as hydrogen gas, because aluminum is highly reactive with oxygen. Hydrogen gas is useful as the carrier gas for the present invention. It is preferable that hydrogen gas have a purity of 99.999% or more.

In order to form a uniform aluminum thin film on a substrate having a large step without causing any breakage of the film according to the present invention, it is necessary to maintain the substrate at a temperature lower than the melting point of aluminum, in addition to the utilization of the disproportionation reaction of the above equation (1). It is desirable that the substrate be maintained at a temperature of about 400° C. or less during the deposition of the aluminum thin film, from the point of view of adhesion of the thin film to the substrate.

The AlCl used in the equation (1) may be prepared by reacting aluminum (Al) with chlorine (Cl$_2$). However, it is preferable that the AlCl be prepared according to the following equation:

$$Al + AlX_3 \rightarrow 3AlX \qquad (2)$$

In the case where the reaction of the equation (2) is used to prepare AlCl, trivalent aluminum chloride (AlCl$_3$) and metallic aluminum (Al) which are used as the raw materials can be easily obtained in the form of a high purity of 99.9999% or more with respect to the impurities, particularly, oxidizing impurities such as O$_2$ and H$_2$O. Because the reaction of Al with AlCl$_3$ according to the equation (2) is endothermic, gaseous AlCl can be obtained at an elevated temperature.

The present invention is illustrated in more detail, below, with reference to the accompanying drawings.

Figure 1:
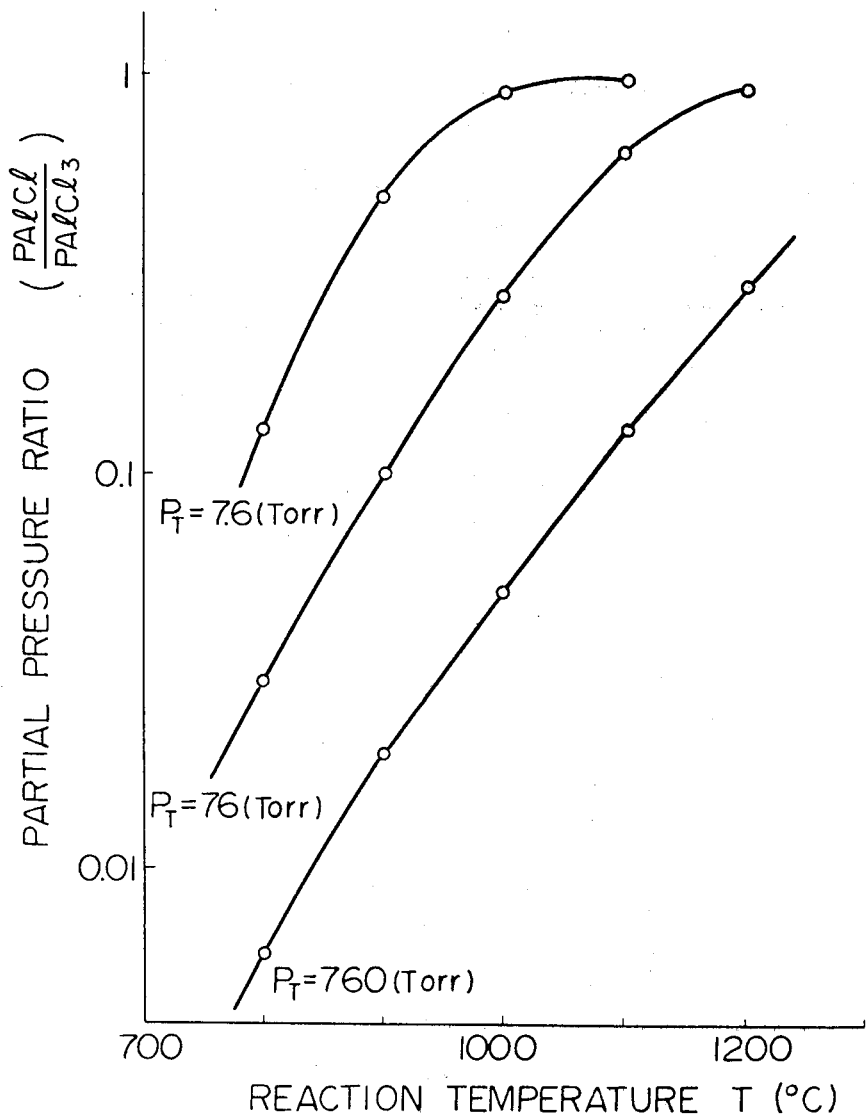
FIG. 1 is a graph indicating the relationship between the partial pressure ratio of AlCl to AlCl$_3$ and the reaction temperature.

Referring to FIG. 1, there is shown the partial pressure ratio of AlCl to AlCl$_3$ under an equilibrium condition at various temperatures. In FIG. 1, the abscissa indicates the reaction temperature, while the ordinate indicates the partial pressure ratio. It is apparent from FIG. 1 that the higher the reaction temperature, the higher the ratio of the partial pressure of AlCl (hereinafter referred to as $P_{AlCl}$) to the partial pressure of AlCl$_3$ (hereinafter referred to as $P_{AlCl_3}$), i.e., $P_{AlCl}/P_{AlCl_3}$. That is, as the reaction temperature is increased, a large amount of AlCl is produced. Thus, when the produced AlCl is decomposed into AlCl$_3$ and Al in a low temperature region, a large amount of Al is produced.

Therefore, in the case where Al and AlCl$_3$ are used as the raw material, it is possible for the reaction of Al with AlCl$_3$ to be carried out at a high temperature and for the disproportionation reaction of the produced AlCl to be carried out at a low temperature, whereby the produced Al is deposited on a substrate.

When the reaction of Al with AlCl$_3$ is carried out in a reaction tube at a total pressure (hereinafter referred to as $P_T$) of 760 Torr, i.e. normal pressure, the partial pressure ratio $P_{AlCl}/P_{AlCl_3}$ is approximately 0.3 at a temperature of 1200° C., while it is about 0.006 at a temperature of 800° C. Therefore, when Al is reacted with AlCl$_3$ at a temperature of 800° C. under normal pressure, substantially all of the produced AlCl is decomposed into AlCl$_3$ and Al. However, because aluminum is in a melted, or liquid state at 800° C., a uniform vapor phase growth of aluminum does not take place. In order that the produced Al is uniformly deposited on the substrate, it is necessary for the reaction tube to be provided with a high temperature region, in which the reaction of Al with AlCl$_3$ is carried out, and a low temperature region, in which the produced Al is deposited on the substrate. It is preferable that the difference between the high temperature region and the low temperature region be 600° C. or more. The temperature difference may be generated by heating these regions separately or by using local cooling.

Generally, when the pressure in the reaction tube is maintained constant in the disproportionation reaction of AlCl, the partial pressure ratio $P_{AlCl}/P_{AlCl_3}$ is reduced to 1/100 times the original value at a temperature drop of 300° C., as is shown in FIG. 1. Therefore, a temperature drop of at least 300° C. can cause the partial pressure ratio $P_{AlCl}/P_{AlCl_3}$ to drop by 1/100 and thus the produced AlCl to be decomposed into Al and AlCl$_3$ to a satisfactory extent.

From a point of view of the life of the reaction tube, it is desirable for a large amount of AlCl to be produced under $P_T$ of normal pressure or less at a relatively low temperature. This object can be satisfactorily attained in accordance with the present invention. As is clearly apparent from FIG. 1, in the case of $P_T=7.6$ Torr, for example, the partial pressure ratio $P_{AlCl}/P_{AlCl_3}$ is about 0.13, even at a temperature of 800° C. In this case, the $P_{AlCl}$ is much higher than that in the case of $P_T=760$ Torr. When the preparation of AlCl is carried out at such a low temperature, it is easy to adjust the substrate to a temperature lower than the melting point of aluminum, which makes it possible to easily obtain a uniform thin film of aluminum without causing any breakage thereof.

A concrete means for implementing the method of the present invention is illustrated in the drawings and described below.

Figure 2:
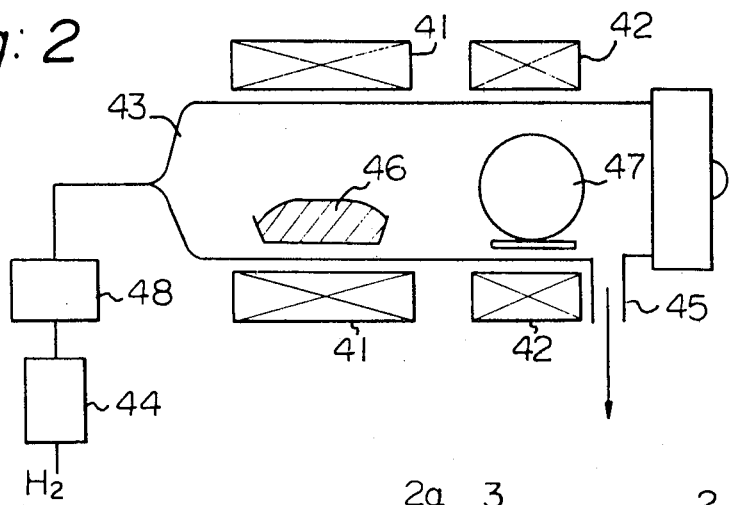
FIG. 2 is an explanatory view of an apparatus for carrying out the method of the present invention.

Referring to FIG. 2, there is shown an explanatory view of one example of the apparatus for forming a metallic thin film according to the present invention. In FIG. 2, the reference numerals 41, 42 represent electric heaters set to temperatures of 1000° C. and 400° C., respectively. The reference numerals 43 and 44 represent a quartz reaction tube comprising a horizontal-type reaction tube and a controller for gas flow, respectively. Hydrogen gas (H$_2$), as a carrier gas, is fed into the reaction tube 43. A gas-evacuating port 45 is connected to a booster and a vacuum rotary pump (not shown). The reference numerals 46 and 47 represent molten aluminum and one or more semiconductor silicon wafers, respectively. The distance between the molten aluminum 46 and the wafer 47 is 50 cm. The reference numeral 48 represents a container containing AlCl$_3$. Gaseous AlCl$_3$ in admixture with H$_2$ as a carrier gas is fed into the reaction tube 43.

The present invention is illustrated by the following examples.

EXAMPLE 1

Figure 3:
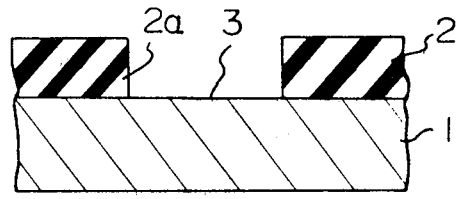
FIG. 3 is a cross-sectional view of a substrate having a step on the surface thereof.

FIG. 3 shows a cross sectional view of a silicon (Si) semiconductor substrate 1 on which a SiO$_2$ layer 2 having a thickness of about 1 micron is formed and which substrate 1 has an exposed main plane 3 formed by selectively etching the SiO$_2$ layer 2. As the selective etching was carried out by a conventional reactive sputtering etching using a photo-resist film (not shown) as a mask, the resultant wall or step 2a of the etched portion is almost perpendicular.

Figure 4:
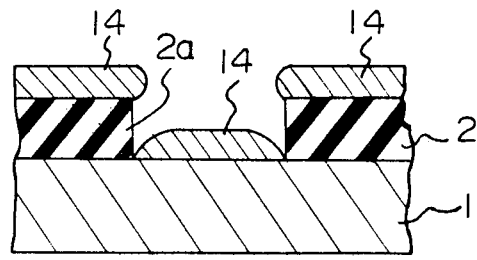
FIG. 4 is a cross-sectional view of the substrate shown in FIG. 3 on which an aluminum layer is deposited according to the conventional art.

As a comparison, a cross-sectional view is shown in FIG. 4 of the silicon semiconductor substrate 1, as shown in FIG. 3, but on which an aluminum thin film 14 having a thickness of 5000 Å is formed by the conventional vapor deposition method. Even if the substrate were rotated during the vapor depositing procedure, it was impossible to form the aluminum thin film 14 on the wall or step 2a because of a self-shadow effect.

An example of the present invention was carried out by using the apparatus shown in FIG. 2. Hydrogen gas (H$_2$) was flowed at a flow rate of 200 cc/min and the pressure within the reaction tube 43 was maintained at constant values of normal pressure and 10 Torr. When AlCl$_3$ was heated to a temperature of about 1000° C., the AlCl$_3$ almost completely reacted with the molten aluminum 46 to form AlCl. Then, the produced AlCl was transported to a low temperature region in the horizontal-type reaction tube which is heated by the heater 42. During this transportation period a temperature drop from 1000° C. to about 400° C. occurred. The wafer 47 which was located in a direction parallel to the AlCl stream, was set to a surface temperature of 400° C. The cross section of the wafer 47 was as shown in FIG. 5.

On reaching the region above the wafer 47 in the reaction tube 43, the AlCl released AlCl$_3$, whereby an aluminum thin film was deposited on the wafer 47 at a deposition rate of about 500 Å/min.

Figure 5:
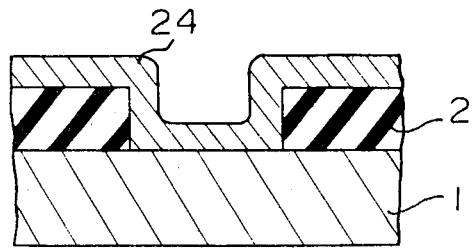
FIG. 5 is a cross-sectional view of the substrate shown in FIG. 3 on which an aluminum layer is deposited according to the method of the present invention.

FIG. 5 shows a cross sectional view of the silicon semiconductor substrate 1 on which an aluminum thin film 24 having a thickness of 5000 Å is formed at the total pressures (P$_T$) of normal pressure and 10 Torr, respectively, by the disproportionation reaction starting from AlCl$_3$ and Al as the raw material. As is shown in FIG. 5, in accordance with the present invention, it was possible to form an aluminum thin film in an approximately uniform thickness on the wall 2a of the SiO$_2$ film as well as on the surfaces of the silicon semiconductor substrate 1 and the SiO$_2$ film 2. The decomposition of AlCl can also be carried out in a gas-plasma atmosphere.

I claim:

1. A method for forming an aluminum thin film by vapor phase growth on a semiconductor substrate having a step, comprising the steps of:

decomposing a monovalent aluminum halide into a trivalent aluminum halide and metallic aluminum; and depositing said metallic aluminum on said semiconductor substrate which is maintained at a temperature lower than the melting point of said metallic aluminum and forming a substantially uniform aluminum thin film thereon which covers said step without breaks.

2. A method according to claim 1, wherein said metallic aluminum is deposited on said semiconductor substrate in a reduced-pressure atmosphere.

3. A method according to claim 1, wherein the decomposition reaction of said monovalent aluminum halide is carried out in a hydrogen atmosphere.

4. A method according to claim 1, 2 or 3 wherein the temperature of said semiconductor substrate is about 400° C. or less.

5. A method according to claim 1, wherein said decomposition reaction of said monovalent aluminum halide is carried out by reducing the temperature of said monovalent aluminum halide by at least 300° C.

6. A method according to claim 5, wherein said temperature reduction is effected while said monovalent aluminum halide flows in a horizontal-type reaction tube.

7. A method according to claim 6, wherein said semiconductor substrate is located in said horizontal-type reaction tube in such a manner that the main plane of said substrate is substantially parallel to the direction of flow of said aluminum halide.

8. A method according to claim 2, wherein said reduced pressure atmosphere is at a pressure of between 7.6 and 10 Torr.

9. A method according to claim 2, wherein said monovalent aluminum halide is decomposed at a temperature in the range of 800° C. to 1200° C. and the temperature of said semiconductor substrate is at least 600° C. lower.

* * * * *

UNITED STATES PATENT AND TRADEMARK OFFICE
CERTIFICATE OF CORRECTION

PATENT NO. : 4,430,364

DATED : February 7, 1984

INVENTOR(S) : Ito

It is certified that error appears in the above-identified patent and that said Letters Patent is hereby corrected as shown below:

```
Front page, [56] References Cited, "Owalline" should
     be --Oualline, Jr., et al.--;

"Heinecke" should be --Heinecke et al.--;

"Silvectri" should be --Silvestri--.

[56] ABSTRACT, line 16, "the an" should be --an--.

Col. 1, line 14, after "pattern" delete ",";
     line 40, "number of the" should be --the
          number of--.

Col. 3, line 68, ", and;" should be --; and--.
```

Signed and Sealed this

Thirty-first Day of July 1984

[SEAL]

Attest:

GERALD J. MOSSINGHOFF

*Attesting Officer*  *Commissioner of Patents and Trademarks*